United States Patent
Nisbet

(10) Patent No.: US 6,288,660 B1
(45) Date of Patent: Sep. 11, 2001

(54) BICMOS CIRCUIT FOR CONTROLLING A BIPOLAR CURRENT SOURCE

(75) Inventor: Graeme Arthur Nisbet, Cheltenham (GB)

(73) Assignee: Telefonaktiebolaget LM Ericsson, Stockholm (SE)

(*) Notice: Subject to any disclaimer, the term of this patent is extended or adjusted under 35 U.S.C. 154(b) by 0 days.

(21) Appl. No.: 09/271,943

(22) Filed: Mar. 18, 1999

(30) Foreign Application Priority Data

Mar. 18, 1998 (GB) .................................... 9805827

(51) Int. Cl.[7] .................................................. H03M 1/66
(52) U.S. Cl. ....................... 341/144; 326/110; 307/574; 327/530
(58) Field of Search ............................ 341/144; 327/530, 327/66; 307/574, 446, 570, 455, 110; 326/66, 110

(56) References Cited

U.S. PATENT DOCUMENTS

| 4,437,025 | 3/1984 | Liu . |
| 4,438,352 | 3/1984 | Mardkha . |

(List continued on next page.)

FOREIGN PATENT DOCUMENTS

| 189571 | 8/1986 | (EP) . |
| 194134 | 9/1986 | (EP) . |
| 238358 | 9/1987 | (EP) . |
| 0 436 823 | 7/1991 | (EP) . |
| 0 603 899 | 6/1994 | (EP) . |
| 647029 | 4/1995 | (EP) . |
| 0 664 595 | 7/1995 | (EP) . |
| 765038 | 3/1997 | (EP) . |
| 02013131 | 1/1990 | (JP) . |
| 04165813 | 6/1992 | (JP) . |
| WO 88 05228 | 7/1988 | (WO) . |
| WO 93/17498 | 9/1993 | (WO) . |

OTHER PUBLICATIONS

Sylvan, K., UK Patent Office Search Report under Section 17(5) on GB 9805827.4, Jun. 10, 1998, pp. 1–2.
Klingens–Herklots, P., International Search Report for International App. No. PCT/EP99/01773, pp. 1–9; Aug. 11, 1999.

Primary Examiner—Peguy JeanPierre
Assistant Examiner—Jean Bruner Jeanglaude
(74) Attorney, Agent, or Firm—Jenkens & Gilchrist, P

(57) ABSTRACT

There is described a BiCMOS switch circuit which allows a low voltage CMOS signal to control a bipolar current source or sink circuit. The circuit includes a current mirror circuit, drawing a constant current through a first bipolar transistor. The collector of that transistor is connected firstly through a second bipolar transistor to a circuit output, and secondly through a CMOS transistor to a positive voltage supply. Depending on an input control signal supplied to the gate of the CMOS transistor, that device can be switched on or off. When the CMOS transistor is switched off, the constant current through the first bipolar transistor is drawn through the circuit output. When the CMOS transistor is switched on, the constant current through the first bipolar transistor is drawn through the CMOS transistor, and the output current is zero. A digital-to-analog converter can be formed by making a group of such circuits, with half of each current mirror circuit in common, the circuits having different constant currents, and receiving different bits of an input digital signal at their respective contrtol inputs.

9 Claims, 4 Drawing Sheets

U.S. PATENT DOCUMENTS

| | | |
|---|---|---|
| 4,469,959 | 9/1984 | Luke et al. . |
| 4,475,050 | 10/1984 | Noufer et al. . |
| 4,485,317 | 11/1984 | Davies, Jr. . |
| 4,490,633 | 12/1984 | Noufer et al. . |
| 4,555,642 | 11/1985 | Morales . |
| 4,578,600 | 3/1986 | Magee . |
| 4,677,325 | 6/1987 | Einzinger et al. .................. 307/574 |
| 4,939,478 | 7/1990 | Heimsch et al. ..................... 330/253 |
| 4,999,519 | 3/1991 | Kitsukawa et al. .................. 307/446 |
| 5,075,574 | 12/1991 | Boudon ................................ 307/455 |
| 5,164,725 * | 11/1992 | Long ..................................... 341/144 |
| 5,218,244 | 6/1993 | Nokubo ................................ 307/446 |
| 5,225,717 | 7/1993 | Shiomi et al. ........................ 307/446 |
| 5,338,987 | 8/1994 | Tomasetti et al. ................... 307/570 |
| 5,420,529 | 5/1995 | Guay et al. .......................... 326/115 |
| 5,434,518 | 7/1995 | Sinh et al. ............................. 326/66 |
| 5,479,005 | 12/1995 | Okawa ................................. 326/110 |
| 5,485,106 | 1/1996 | Drost et al. ............................. 326/66 |
| 5,517,152 | 5/1996 | Miki et al. ........................... 327/530 |
| 5,528,171 | 6/1996 | Doi et al. ............................... 326/66 |
| 5,532,616 | 7/1996 | Keeney ................................. 326/30 |
| 5,548,288 | 8/1996 | Lueng .................................. 341/136 |
| 5,717,581 * | 2/1998 | Canclini ............................... 307/110 |

* cited by examiner

US 6,288,660 B1

BICMOS CIRCUIT FOR CONTROLLING A BIPOLAR CURRENT SOURCE

TECHNICAL FIELD

This invention relates to a switch circuit, and more particularly to a BiCMOS circuit which allows a low voltage CMOS signal to control a bipolar current source or sink circuit.

BACKGROUND OF THE INVENTION

BiCMOS current switching circuits are known, in which a signal applied to a CMOS transistor determines a current through a bipolar transistor. For example, current steering digital-to-analog converters may include a plurality of bipolar devices, each bipolar device having a respective CMOS device associated with it, and with the total current drawn by the bipolar devices being determined by the inputs to the CMOS devices.

As an example of this, U.S. Pat. No. 5,548,288 describes a current cell and current switch for use in a current-steering digital-to-analog converter. In the circuit described therein, an output current is determined by the digital signal applied to the circuit inputs.

However, the circuit described therein has the disadvantage that it includes a relatively large number of components and hence that it uses a relatively large area in an integrated circuit.

SUMMARY OF THE INVENTION

The present invention provides a circuit which, in some embodiments, can be implemented using fewer components than at least some of the prior art circuits, and hence uses a smaller area in an integrated circuit.

More specifically, one embodiment of a first aspect of the invention provides a BiCMOS circuit which includes a first bipolar transistor which, in operation, draws a current. The collector of the first bipolar transistor is connected to a voltage source through a CMOS transistor, and to a circuit output through a second bipolar transistor. The output current drawn through the second bipolar transistor depends on whether the CMOS transistor is turned on or off by a control voltage applied thereto.

According to a second aspect of the invention, there is provided a digital-to-analog converter which includes a plurality of BiCMOS circuits in accordance with the first aspect of the invention. The respective first bipolar transistors thereof preferably form respective current mirror circuits with a further bipolar transistor, and draw respective currents which can be added to form a total output current which depends on the respective control voltages applied to the respective CMOS transistors.

According to a third aspect of the invention, there is provided a charge pump circuit which includes two BiCMOS circuits in accordance with the first aspect of the invention. A first circuit is configured as a current source, and a second is configured as a current sink. Controlling the inputs to the two circuits results in changes in the output current.

DETAILED DESCRIPTION OF PREFERRED EMBODIMENTS

Figure 1:
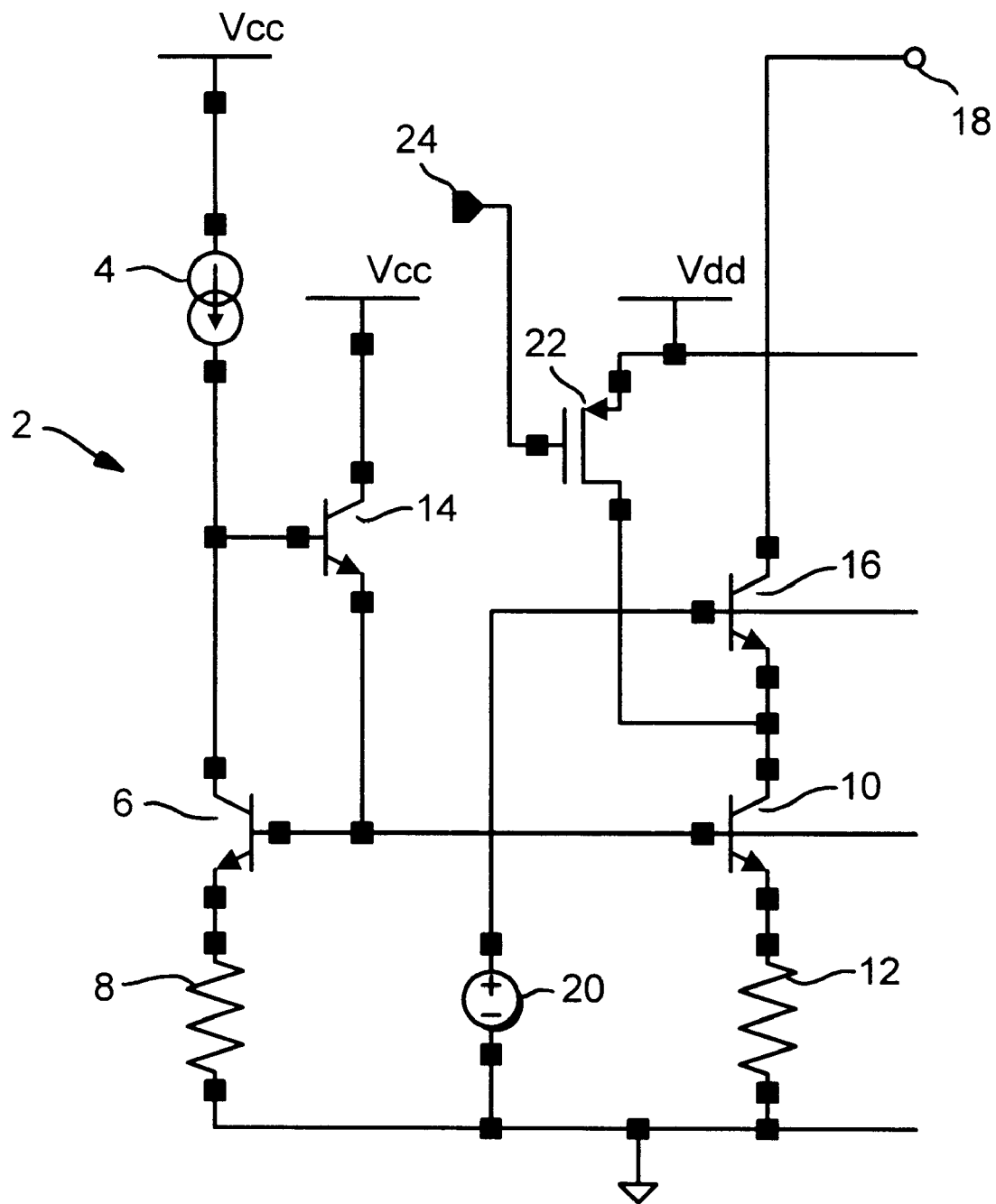
FIG. 1 is a circuit diagram of a first current sink circuit in accordance with the invention.

FIG. 1 shows a first circuit in accordance with the invention, acting as a switched current sink. The circuit of FIG. 1 is based around a conventional bipolar emitter follower augmented current mirror circuit 2, including a constant current source 4, producing a constant current Iref, connected between an appropriate bipolar positive voltage supply Vcc and the collector of an NPN bipolar transistor 6, the emitter of which is connected to ground through a resistor 8 of resistance R. The base of the transistor 6 is connected to the base of a further NPN bipolar transistor 10, the emitter of which is connected to ground through a resistor 12. In this illustrated embodiment, the resistor 12 has a resistance value R, equal to that of the resistor 8. The effect of the resistors 8,12 is to control the currents through the transistors 6,10. It will be appreciated that these resistors can be omitted from the circuit, and any necessary scaling can then be achieved by scaling the emitter areas of the transistors.

The current mirror circuit 2 further includes a third NPN bipolar transistor 14, the base of which is connected to the collector of the transistor 6, the collector of which is connected to the positive voltage supply Vcc, and the emitter of which is connected to the bases of the transistors 6, 10. It will be appreciated that this emitter follower transistor 14 may be omitted, if the resulting decrease in the accuracy of the current mirror is acceptable.

As part of the switch in accordance with this illustrated embodiment of the invention, a fourth NPN bipolar transistor 16 has its emitter connected to the collector of the transistor 10, and its collector connected to an output terminal 18. The base of the transistor 16 is biased to a voltage level set by a voltage source 20, the negative terminal of which is connected to ground. For example, this voltage level may be set to 3. Vbe, where Vbe is the base-emitter voltage required to turn the transistor on.

Finally, the circuit of FIG. 1 includes a PMOS transistor 22, the source of which is connected to an appropriate positive MOS voltage supply Vdd, and the drain of which is connected to the connection of the emitter of the transistor 16 and the collector of the transistor 10. The gate terminal of the PMOS transistor 22 is connected to a control input 24, which receives a logic input signal.

When the input signal at the control input 24 is high, the MOS transistor 22 is turned off, and the current mirror circuit 2 operates in a conventional way. Thus the bipolar transistor 16 is turned on, and the collector current of transistor 10 is drawn through the transistor 16, and hence appears as the output current drawn through the output terminal 18. If, as in this illustrated embodiment, the resistance value of the resistor 12 is equal to that of the resistor 8, the output current can be made equal to Iref, the current generated by the current source 4.

If, on the other hand, the input signal at the control input 24 is low, the MOS transistor 22 is turned on. In that case, the voltage at the connection of the emitter of the transistor 16 and the collector of the transistor 10 is high (close to Vdd, depending on the characteristics of the MOS transistor 22), and the transistor 16 is turned off. Hence, all of the collector current of the transistor 10 is drawn through the MOS transistor 22.

Thus, the output current, drawn through the output terminal 18, is zero.

The output current can be used to power up or down any subsequent circuit block. It can thus be seen that the output current can be switched by the digital signal applied to the gate of the MOS transistor 22, without requiring switching of the control signal level between CMOS and CML levels. Moreover, if a subsequent controlled circuit block is a high voltage block, this can be controlled by a low voltage CMOS signal.

Figure 2:
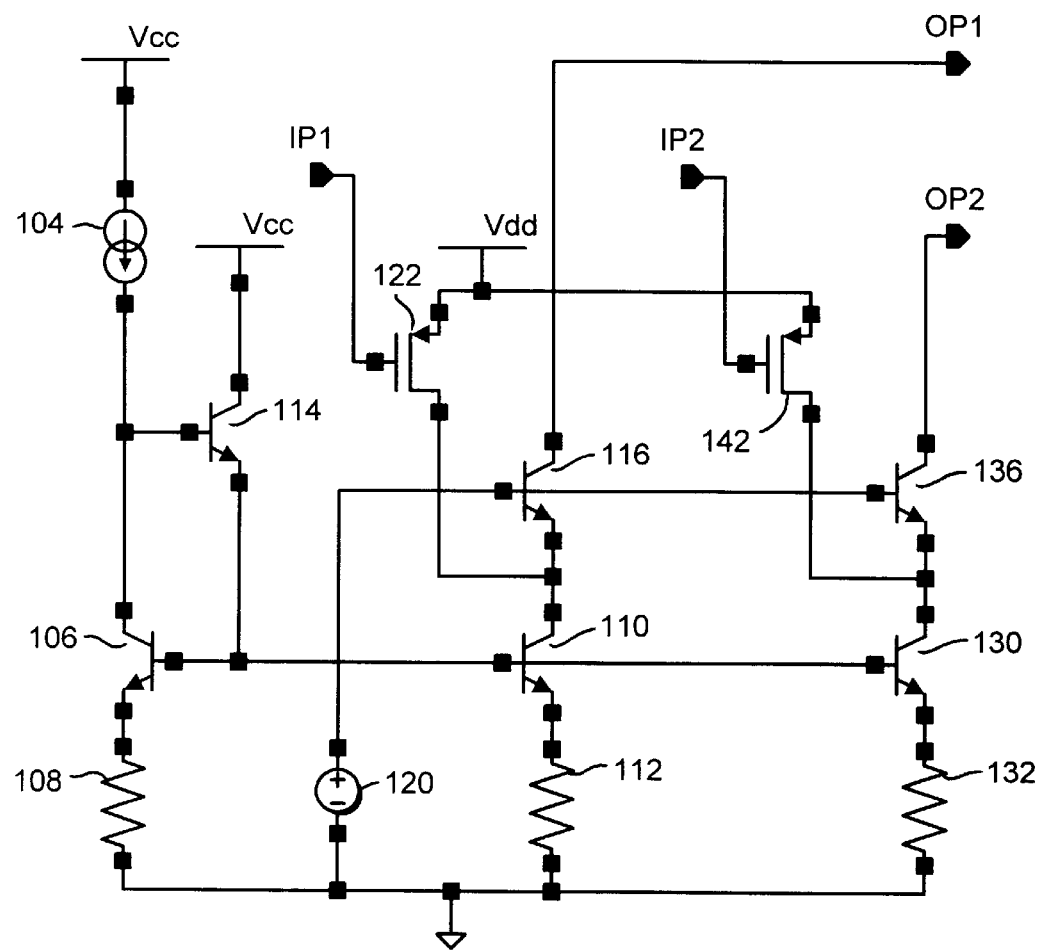
FIG. 2 is a circuit diagram of a second current sink circuit in accordance with the invention.

FIG. 2 shows a digital-to-analog converter, based on the switch of FIG. 1. In the D-A converter of FIG. 2, there are multiple inputs, for example receiving different bits of an input digital signal, and respective outputs. Each such input and output are associated with a respective current mirror circuit of the type shown in FIG. 1.

In FIG. 2, constant current source 104, producing a constant current Iref, is connected between an appropriate bipolar positive voltage supply Vcc and the collector of an NPN bipolar transistor 106, the emitter of which is connected to ground through a resistor 108 of resistance R. The transistor 106 is common to, and forms one half of, each of the respective current mirror circuits associated with the different inputs.

As in FIG. 1, the circuit further includes a bipolar transistor 114, the base of which is connected to the collector of the transistor 106, the collector of which is connected to the positive voltage supply Vcc, and the emitter of which is connected to the base of the transistor 106.

Also as in FIG. 1, the circuit of FIG. 2 includes a further NPN bipolar transistor 110, the base of which is connected to the base of the transistor 106, and the emitter of which is connected to ground through a resistor 112.

In this illustrated embodiment, the resistor 112 has a resistance value R, equal to that of the resistor 108, and so the current drawn through the transistor 110 is equal to Iref, the current produced by the current source 104.

A fourth NPN bipolar transistor 116 has its emitter connected to the collector of the transistor 110, and its collector connected to an output terminal OP1. The base of the transistor 116 is biased to a voltage level set by a voltage source 120, the negative terminal of which is connected to ground. For example, this voltage level may be set to 3.Vbe, where Vbe is the base-emitter voltage required to turn the transistor on.

Finally, the first current mirror circuit includes a PMOS transistor 122, the source of which is connected to an appropriate positive MOS voltage supply Vdd, and the drain of which is connected to the connection of the emitter of the transistor 116 and the collector of the transistor 110. The gate terminal of the PMOS transistor 122 is connected to a control input IP1, which receives a logic input signal.

Similarly, the second current mirror circuit includes a further NPN bipolar transistor 130, the base of which is connected to the base of the transistor 106, and the emitter of which is connected to ground through a resistor 132.

In this illustrated embodiment, the resistor 132 has a resistance value R/n, that is, an integer fraction of that of the resistor 108.

A further NPN bipolar transistor 136 has its emitter connected to the collector of the transistor 130, and its collector connected to an output terminal OP2. Like the transistor 116, the base of the transistor 136 is biased to the voltage level set by the voltage source 120.

Finally, the second current mirror circuit includes a PMOS transistor 142, the source of which is connected to the positive MOS voltage supply Vdd, and the drain of which is connected to the connection of the emitter of the transistor 136 and the collector of the transistor 130. The gate terminal of the PMOS transistor 142 is connected to a control input IP2, which receives a logic input signal.

It will be appreciated that, although the circuit shown in FIG. 2 has two circuit inputs, two outputs, and two current mirror circuits, it may include any convenient number of such circuits, with bipolar transistors 130, 136, resistor 132 and PMOS transistor 142 being repeated as required, and perhaps with different resistance values of the resistor(s).

The circuit of FIG. 2 operates in a similar way to that of FIG. 1. Thus when the input signal at one of the control inputs IP1 or IP2 is high, the associated MOS transistor 122 or 142 is turned off, and the collector current of the transistor 110 or 130 is drawn through the transistor 116 or 136, and hence appears as the output current drawn through the output terminal OP1 or OP2.

If, on the other hand, the input signal at one of the control inputs OP1, OP2 is low, the associated MOS transistor 122, 142 is turned on. In that case, the transistor 116 or 136 is turned off. Hence, all of the collector current of the transistor 110 or 130 is drawn through the MOS transistor 122 or 142, and the output current, drawn through the output terminal OP1 or OP2 is zero.

The output currents at the output terminals OP1 and OP2 may be summed to give an overall analog output current in response to the digital input at the input terminals IP1 and IP2.

If, as in this illustrated embodiment, the resistance value of the resistor 112 is equal to R, namely that of the resistor 108, the output current at output terminal OP1 can be made equal to Iref, the current generated by the current source 104. Meanwhile, if the resistance value of the resistor 132 is equal to R/n, namely an integer fraction of that of the resistor 108, the output current at output terminal OP2 can be made equal to n.Iref, an integer multiple of the current generated by the current source 104.

Thus, in this example, by selection of the digital signal applied to the two inputs IP1, IP2, the overall output current can be made equal to 0, Iref, n.Iref, or (n+1).Iref. For example, this may be particularly useful if n=2. Where there are more than two inputs and outputs, the resistance values of the resistors may be chosen as values of R/n, with n being successive powers of 2 in the different current mirror circuits.

Figure 3:
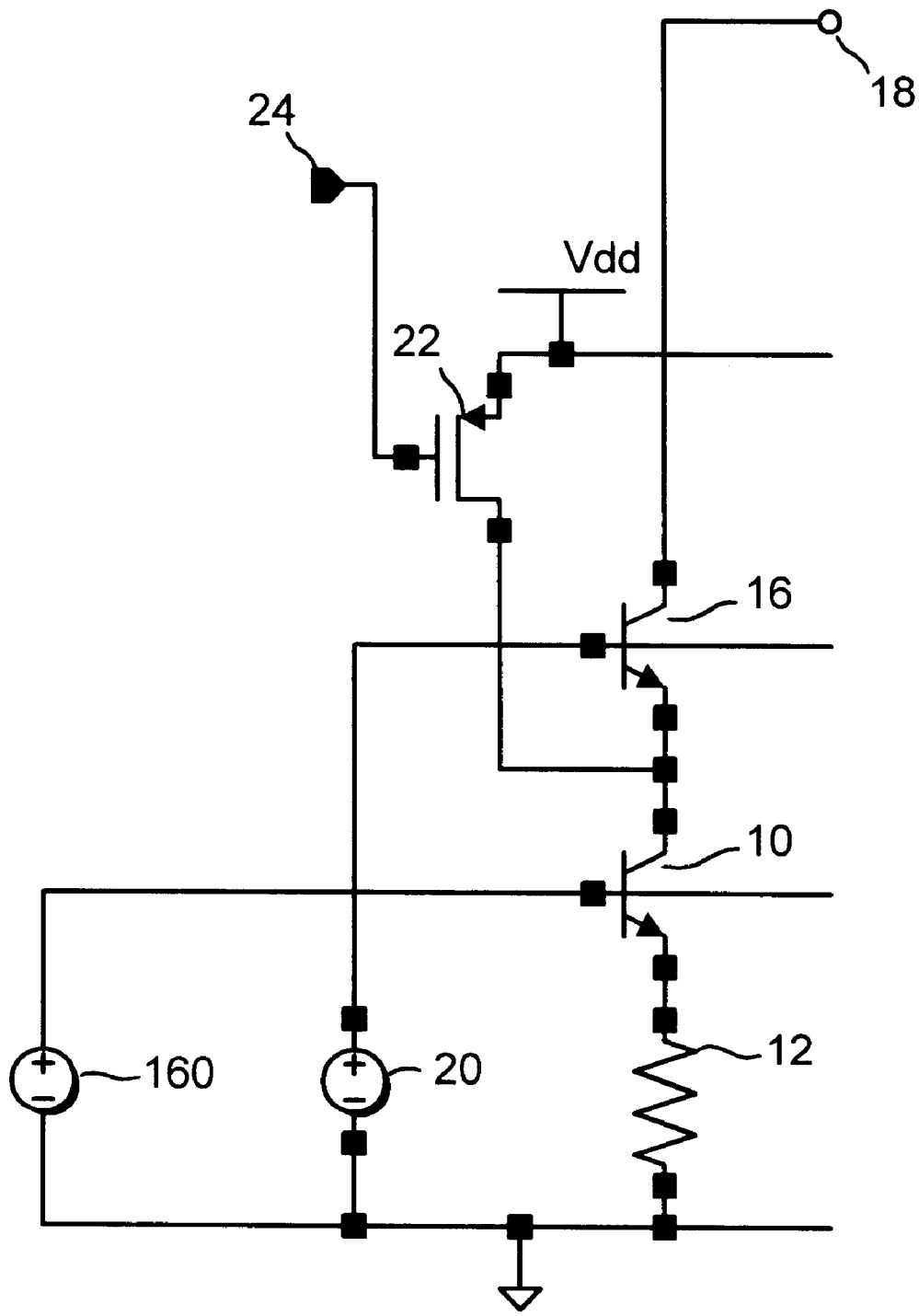
FIG. 3 is a circuit diagram of a third current sink circuit in accordance with the invention.

FIG. 3 shows an alternative circuit in accordance with the invention, in which components which correspond to components of the circuit of FIG. 1 are indicated by the same reference numerals. In the circuit of FIG. 3, there is no current mirror, but the current through the transistor 10 arises because there is a reference voltage source 160 connected between the base of the transistor 10 and the ground rail. The voltage drop across the resistor 12 is set by the reference voltage and the base-emitter voltage of the transistor 10, and the value of the resistor 12 then determines the current through the transistor 10.

The circuits have been described herein as current sinks, but analogous current source versions may be made by using PNP bipolar transistors and NMOS transistors instead of PMOS at the control inputs.

Figure 4:
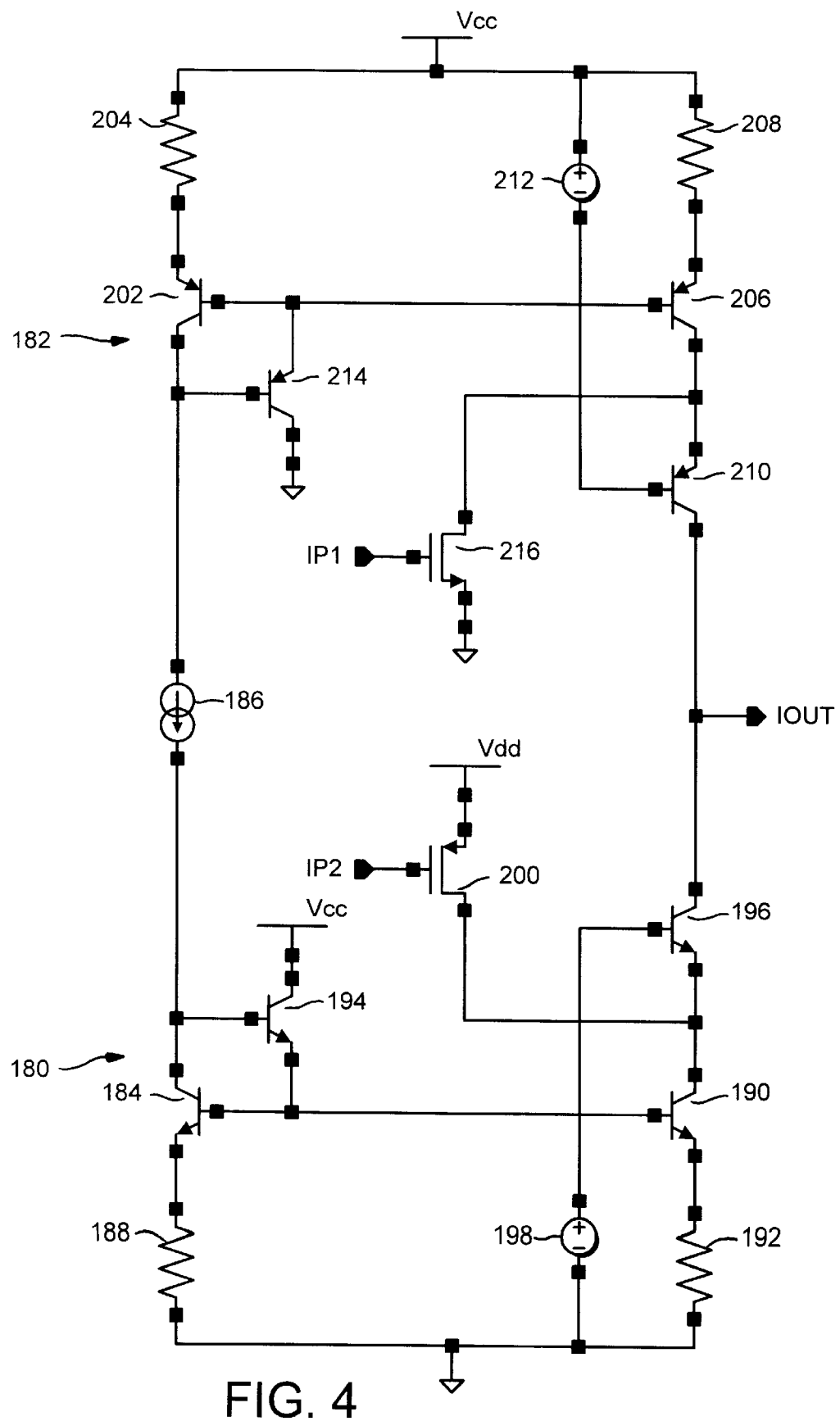
FIG. 4 is a circuit diagram of a charge pump circuit in accordance with the invention.

FIG. 4 shows a charge pump circuit in accordance with the invention, made up of two of the circuits described previously, namely a current sink circuit 180, and a current source circuit 182.

The current sink circuit 180 includes an NPN bipolar transistor 184, the collector terminal of which is connected to a constant current source 186, producing a constant current Iref. The emitter terminal of the transistor 184 is connected to ground through a resister 188. The base terminal of the transistor 184 is connected to the base terminal of a further NPN bipolar transistor 190, the emitter terminal of which is connected to ground through a further resister 192. A third NPN bipolar transistor 194 has its base terminal connected to the collector terminal of the transistor 184, its collector terminal connected to a positive supply voltage Vcc, and its emitter terminal connected to the base terminals of the transistors 184, 190. A fourth NPN bipolar transistor 196 has its emitter terminal connected to the collector terminal of the transistor 190, and its collector terminal connected to an output point at which an output value IOUT is obtained. The base terminal of the transistor 196 is biased to an appropriate level by a voltage source 198.

Finally, the current sink circuit 180 includes a PMOS transistor 200, the source of which is connected to a positive voltage supply Vdd, and the drain of which is connected to the node between the emitter of the transistor 196 and the collector of the transistor 190. The gate terminal of the PMOS transister 200 is connected to a control input IP2, which receives a logic input signal.

As described previously with reference to the circuit of FIG. 1, when the input signal at the terminal IP2 is high, a current equal to the reference current Iref is drawn from the output terminal IOUT, whereas, when the input signal is low, no current is drawn.

As previously described, the current source circuit 182 is analogous to the current sink circuit 180.

More specifically, the current source circuit 182 includes a PNP transistor 202, the emitter terminal of which is connected through a resistor 204 to a positive supply voltage Vcc. The collector terminal of the transistor 202 is connected to the current source 186, and the base terminal thereof is connected to the base terminal of a second PNP bipolar transistor 206. The emitter terminal of this second PNP transistor is also connected to the positive supply rail through a respective resistor 208, and the collector terminal is connected to the emitter terminal of a third PNP transistor 210. The collector terminal of this third transistor 210 is connected to the output terminal IOUT, and the base terminal thereof is biased to an appropriate voltage level by a voltage supply 212. Meanwhile, a fourth PNP bipolar transistor 214 has its emitter terminal, connected to the base terminals of the transistors 202, 206, its base terminal connected to the collector terminal of the transistor 202, and its collector terminal connected to ground.

An NMOS transistor 216 has its source terminal connected to ground, its drain terminal connected to the node between the collector terminal of the transistor 206 and the emitter terminal of the transistor 210, and has its gate terminal connected to an input terminal IP1. When the signal at this input is low, a current equal to the reference current Iref is supplied to the output terminal IOUT, whereas, when the input signal supplied to the input terminal IP1 is high, no current is supplied.

Thus, the overall circuit acts as a charge pump circuit, with the output current depending on the values of the input signals which are applied.

When both inputs are low, a current equal to the reference current Iref is supplied to the output terminal IOUT. When both inputs are high, a current equal to the reference Iref is drawn from the output terminal IOUT. When the input signal at the terminal IP1 is high, and the input signal at the terminal IP2 is low, no current is supplied to the output.

When the signal at the input terminal IP1 is low, and the signal at the input terminal IP2 is high, the current sink and current source circuits are both active, and the current supplied to the output terminal is nominally zero. However, in this condition, any mismatch between the two circuits will result in a leakage current, and so, for practical purposes, this state is preferably avoided.

There is thus described a circuit which allows a low voltage CMOS signal to control a bipolar current source or sink circuit, without requiring large numbers of components or large surface areas in an integrated circuit.

What is claimed is:

1. A BiCMOS switch circuit, comprising:
   a first bipolar transistor;
   a second bipolar transistor connected between the collector of the first bipolar transistor and a circuit output;
   a CMOS transistor connected between the collector of the first bipolar transistor and a first voltage supply, a gate terminal of the CMOS transistor being connected to receive an input control signal;
   a current mirror circuit comprising:
      a third bipolar transistor;
      a constant current source connected between a second voltage supply and a collector of the third bipolar transistor; and
      a first resistor connected between ground and an emitter of the third bipolar transistor, and wherein
      a base of the third bipolar transistor is connected to a base of the first bipolar transistor.

2. A BiCMOS switch circuit as claimed in claim 1, further comprising a second resistor connected between ground and an emitter of the first bipolar transistor, and wherein the magnitude of the constant current through the first bipolar transistor is determined by relative resistance values of the first and second resistors.

3. A BiCMOS switch circuit as claimed in claim 1, wherein a base of the second bipolar transistor is biased to a voltage which is sufficient to turn the transistor on when the emitter voltage thereof is zero, but which is lower than the positive supply voltage.

4. A BiCMOS switch circuit as claimed in claim 1, wherein the bipolar transistors are NPN transistors, and the CMOS transistor is a PMOS transistor.

5. A BiCMOS switch circuit as claimed in claim 1, wherein the bipolar transistors are PNP transistors, and the CMOS transistor is an NMOS transistor.

6. A digital-to-analog converter, comprising:
   a plurality of first bipolar transistors;
   a current mirror circuit, drawing respective constant currents through the first bipolar transistors;
   a plurality of second bipolar transistors, each connected between the collector of a respective one of the first bipolar transistors and a respective circuit output;
   a plurality of CMOS transistors, each connected between the collector of a respective one of the first bipolar transistors and a positive voltage supply, wherein gate terminals of the CMOS transistors are connected to receive respective bits of an input digital signal;
   an output circuit, for summing currents at the circuit outputs to give an output analog signal;
   wherein the current mirror circuit comprises:
      a third bipolar transistor;
      a constant current source connected between a voltage supply and a collector of the third bipolar transistor; and a first resistor connected between ground and an emitter of the third bipolar transistor, and wherein a base of the third bipolar transistor is connected to a base of each first bipolar transistor.

7. A digital-to-analog converter as claimed in claim 6, further comprising a plurality of second resistors connected between ground and emitters of the respective first bipolar transistors, and wherein the magnitudes of the respective constant currents through the first bipolar transistors are determined by respective relative resistance values of the first resistor and the second resistors.

8. A BiCMOS switch circuit as claimed in claim 1, where in the first voltage supply is at a different voltage level from the second voltage supply.

9. A charge pump, comprising:

a first BiCMOS switch circuit, comprising:

a first NPN bipolar transistor;

a second NPN bipolar transistor connected between the collector of the first NPN bipolar transistor and a circuit output;

a PMOS transistor connected between the collector of the first NPN bipolar transistor and a first positive voltage supply, a gate terminal of the PMOS transistor being connected to receive a first input control signal; and a current mirror circuit comprising:

a third NPN bipolar transistor;

a constant current source connected between a second positive voltage supply and a collector of the third NPN bipolar transistor; and a first resistor connected between ground and an emitter of the third NPN bipolar transistor, wherein a base of the third NPN bipolar transistor is connected to a base of the first NPN bipolar transistor; and a second BiCMOS switch circuit, comprising:

a first PNP bipolar transistor;

a second PNP bipolar transistor connected between the collector of the first PNP bipolar transistor and the circuit output;

an NMOS transistor connected between the collector of the first PNP bipolar transistor and ground, a gate terminal of the NMOS transistor being connected to receive a second input control signal; and a current mirror circuit comprising:

a third PNP bipolar transistor, wherein the constant current source is connected between ground and a collector of the third PNP bipolar transistor; and a first resistor connected between the second positive voltage supply and an emitter of the third PNP bipolar transistor, wherein a base of the third PNP bipolar transistor is connected to a base of the first PNP bipolar transistor.

* * * * *

UNITED STATES PATENT AND TRADEMARK OFFICE
CERTIFICATE OF CORRECTION

PATENT NO. : 6,288,660 B1
DATED : September 11, 2001
INVENTOR(S) : Graeme Arthur Nisbet It is certified that error appears in the above-identified patent and that said Letters Patent is hereby corrected as shown below:

Title page,
Item [57], ABSTRACT,

Replace "There is described a BICMOS switch circuit which allows a low voltage CMOS signal to control a bipolar current source or sink circuit. The circuit includes a current mirror circuit, drawing a constant current through a first bipolar transistor. The collector of that transistor is connected firstly through a second bipolar transistor to a circuit output, and secondly through a CMOS transistor to a positive voltage supply. Depending on an input control signal supplied to the gate of the CMOS transistor, that device can be switched on or off. When the CMOS transistor is switched off, the constant current through the first bipolar transistor is drawn through the circuit output. When the CMOS transistor is switched on, the constant current through the first bipolar transistor is drawn through the CMOS transistor, and the output current is zero. A digital-to-analog converter can be formed by making a group of such circuits, with half of each current mirror circuit in common, the circuits having different constant currents, and receiving different bits of an input digital signal at their respective contrtol inputs."

With -- A BICMOS switch circuit which allows a low voltage CMOS signal to control a bipolar current source or sink circuit. The circuit includes a current mirror circuit, drawing a constant current through a first bipolar transistor. The collector of that transistor is connected firstly through a second bipolar transistor to a circuit output, and secondly through a CMOS transistor to a positive

UNITED STATES PATENT AND TRADEMARK OFFICE
CERTIFICATE OF CORRECTION

PATENT NO. : 6,288,660 B1
DATED : September 11, 2001
INVENTOR(S) : Graeme Arthur Nisbet It is certified that error appears in the above-identified patent and that said Letters Patent is hereby corrected as shown below:

```
voltage supply.  Depending on
an input control signal supplied
to the gate of the CMOS
transistor, that device can be
switched on or off.  When the
CMOS transistor is switched off,
the constant current through the
first bipolar transistor is drawn
through the circuit output.  When
the CMOS transistor is switched
on, the constant current through
the first bipolar transistor is
drawn through the CMOS transistor,
and the output current is zero.  A
digital-to-analog converter can be
formed by making a group of such
circuits, with half of each
current mirror circuit in common,
the circuits having different
constant currents, and receiving
different bits of an input digital
signal at their respective control
inputs. --
```

Column 5,
Line 22, replace "PMOS transister 200 is connected to a control input IP2,"
with -- PMOS transistor 200 is connected to a control input IP2, --
Line 46, replace "sistor 214 has its emitter terminal, connected to the base"
with -- sistor 214 has its emitter terminal connected to the base --

Signed and Sealed this

Twenty-fifth Day of March, 2003

JAMES E. ROGAN
*Director of the United States Patent and Trademark Office*